United States Patent
Zhu

(10) Patent No.: US 8,294,442 B2
(45) Date of Patent: Oct. 23, 2012

(54) LOW DROPOUT REGULATOR CIRCUIT WITHOUT EXTERNAL CAPACITORS RAPIDLY RESPONDING TO LOAD CHANGE

(75) Inventor: Guojun Zhu, Chengdu (CN)

(73) Assignee: IPGoal Microelectronics (Sichuan) Co., Ltd., High-Tech Incubation Park, Chengdu, Sichuan Province (CN)

( * ) Notice: Subject to any disclaimer, the term of this patent is extended or adjusted under 35 U.S.C. 154(b) by 322 days.

(21) Appl. No.: 12/793,844

(22) Filed: Jun. 4, 2010

(65) Prior Publication Data

US 2011/0121802 A1  May 26, 2011

(30) Foreign Application Priority Data

Nov. 26, 2009 (CN) .......................... 2009 1 0216379

(51) Int. Cl.
  *G05F 1/569* (2006.01)
  *H02H 3/22* (2006.01)
(52) U.S. Cl. ........................................ 323/281; 323/274
(58) Field of Classification Search ................ 361/18, 361/111; 323/223, 226, 268, 273, 274, 276, 323/279, 281, 349
See application file for complete search history.

(56) References Cited

U.S. PATENT DOCUMENTS

| | | | | |
|---|---|---|---|---|
| 4,008,418 A | * | 2/1977 | Murphy | 361/18 |
| 6,201,375 B1 | * | 3/2001 | Larson et al. | 323/277 |
| 7,199,565 B1 | * | 4/2007 | Demolli | 323/273 |
| 7,221,213 B2 | * | 5/2007 | Lee et al. | 327/541 |
| 7,450,354 B2 | * | 11/2008 | Tain et al. | 361/18 |
| 7,714,553 B2 | * | 5/2010 | Lou | 323/276 |
| 7,821,242 B2 | * | 10/2010 | Takagi | 323/275 |
| 8,040,118 B2 | * | 10/2011 | Cho et al. | 323/273 |
| 8,198,875 B2 | * | 6/2012 | Sudou | 323/224 |

* cited by examiner

*Primary Examiner* — Gary L Laxton

(57) ABSTRACT

A low dropout regulator (LDO) circuit without external capacitors rapidly responding to load change includes a slow pathway and a fast pathway for controlling voltage, wherein the slow pathway for providing precise output voltage includes an operational amplifier I0, a driving transistor MPR, a resistor RF1 and a resistor RF2 forming an operational amplifier loop, and the fast pathway for responding to rapid load change includes a comparator I1, a comparator I2, a field effect transistor MN1, a field effect transistor MN2, a driving transistor MPR, a resistor RF1 and a resistor RF2 forming a comparator loop. The circuit is capable of controlling the output voltage by the slow operational amplifier loop and fast comparator loop, so that the load response speed of the LDO is greatly improved without the increase of the system power consumption and external big capacitors.

16 Claims, 3 Drawing Sheets

LOW DROPOUT REGULATOR CIRCUIT WITHOUT EXTERNAL CAPACITORS RAPIDLY RESPONDING TO LOAD CHANGE

BACKGROUND OF THE PRESENT INVENTION

1. Field of Invention

The present invention relates to an analog integrated circuit technology, and more particularly to a low dropout regulator circuit without external capacitors rapidly responding to load change.

2. Description of Related Arts

The low dropout regulator (LDO) is widely used in various analog integrated circuits and mixed-signal integrated circuits owing to its advantages of low output voltage ripple, low noise and low quiescent current.

A conventional LDO circuit is shown in FIG. 1, wherein VREF_GEN is a reference voltage generating circuit, OP is an operational amplifier, MP1 is an output regulating transistor, RF1 and RF2 are feedback resistors, RL is a load resistor, CL is a load capacitor. The working principle of the LDO is described as follows. The reference voltage generating circuit transmits a reference voltage to a negative input node of the operational amplifier, then the feedback resistors feedback a voltage in proportion to the output voltage to a positive input node of the operational amplifier, and then the operational amplifier detects the difference between the feedback voltage and the reference voltage. According to the difference, the gate voltage of the output regulating transistor MP1 is regulated. When the feedback voltage VFB is higher than the reference voltage VREF, the operational amplifier will pull up the gate voltage Vc of the output regulating transistor, then the output voltage VOUT will be decreased so as to lower the feedback voltage VFB to the reference voltage VREF. When the feedback voltage VFB is lower than the reference voltage VREF, the operational amplifier will pull down the gate voltage Vc of the output regulating transistor, then the output voltage VOUT will be increased so as to increase the feedback voltage VFB to the reference voltage VREF. Therefore, the LDO circuit stabilizes the output voltage VOUT by the negative feedback of the operational amplifier and the regulating transistor. When the LDO circuit is stable, the output voltage thereof can be expressed as follows:

$$VOUT=VREF*(RF1+RF2)/RF2$$

For the LDO circuit shown in FIG. 1, when the rapid load transition (ns level) occurs, the transient current what are needed herein is mainly provided by the load capacitor CL for obtaining the stable output voltage. Therefore, it is necessary for the LDO circuit to be provided with a more than µF-level large capacitor by the exterior so as to provide a good load transient response thus increasing the system cost. Furthermore, the resistance of the external capacitor's parasitic resistor will affect the loop stability of the LDO circuit, thus greatly increasing the complexity of the system design. If there is no external capacitor CL, when the rapid load transition (ns level) occurs, it has to be the negative feedback loop to respond to the load transition, so it is required that the bandwidth of the whole loop is larger than GHz. The output regulating transistor MP1 has a very large width-length ratio and a large gate parasitic capacitance, so the current of the operational amplifier must be very large for obtaining the GHz-level loop bandwidth, otherwise the deficiency of the loop bandwidth will cause the big ripple of the output voltage VOUT. When the ripple of the output voltage VOUT exceeds ±10%, the LDO power supply system will not work properly.

SUMMARY OF THE PRESENT INVENTION

An object of the present invention is to provide a low dropout regulator (LDO) circuit without external capacitors rapidly responding to load change, which is capable of controlling the output voltage by two loops of the slow operational amplifier loop and fast comparator loop, so that the load response speed of the LDO is greatly improved without the increase of the power consumption and external large capacitor.

Accordingly, in order to accomplish the above object, the present invention provides a low dropout regulator circuit without external capacitors rapidly responding to load change, comprising:

a slow path for controlling voltage comprising an operational amplifier I0;

a fast path for controlling voltage comprising a comparator I1, a comparator I2, a field effect transistor MN1 and a field effect transistor MN2;

a shared branch comprising a driving transistor MPR, a resistor RF1 and a resistor RF2, wherein said operational amplifier I0, driving transistor MPR, resistor RF1 and resistor RF2 form an operational amplifier loop for providing an accurate output voltage, said comparator I1, comparator I2, field effect transistor MN1, field effect transistor MN2, driving transistor MPR, resistor RF1 and resistor RF2 form a comparator loop for responding to rapid load change; and a reference voltage generating circuit 13 for providing said operational amplifier I0, said comparator I1 and said comparator I2 with three reference voltages VR, VRL and VRH respectively, wherein a relationship among said three reference voltages is VRH>VR>VRL.

The specific circuit connection of the low dropout regulator (LDO) circuit is described as follows:

a negative input of the operational amplifier I0 is connected with the output reference voltage VR of the reference voltage generating circuit 13, a positive input of the operational amplifier I0 is connected with one end of the resistor RF1 and one end of the resistor RF2, an output of the operational amplifier I0 is connected with a gate of the driving transistor MPR;

a positive input of the comparator I1 is connected with the output reference voltage VRL of the reference voltage generating circuit 13, a negative input of the comparator I1 is connected with the end of the resistor RF2, an output of the comparator I1 is connected with a gate of the field effect transistor MN1;

a negative input of the comparator I2 is connected with the output reference voltage VRH of the reference voltage generating circuit 13, a positive input of the comparator I2 is connected with the end of the resistor RF2, an output of the comparator I2 is connected with a gate of the field effect transistor MN2;

a source of the driving transistor MPR is connected with the power supply, a drain of the driving transistor MPR is connected with the other end of the resistor RF1;

a drain of the FET MN1 is connected with the gate of driving transistor MPR, a source of the field effect transistor MN1 is connected with the ground;

a drain of the field effect transistor MN2 is connected with the drain of the driving transistor MPR, a source of the field effect transistor MN2 is connected with the ground;

the end of the resistor RF1 connecting with the operational amplifier I0 is connected with one end of the resistor RF2, the other end of the resistor RF1 is connected with the drain of the driving transistor MPR, the other end of the resistor RF2 is connected with the ground;

the gate of the driving transistor MPR is connected with one end of a resistor Rc, the other end of the resistor Rc is connected with one end of a capacitor Cc, the other end of the capacitor Cc is connected with the drain of the driving transistor MPR.

The working principle of the low dropout regulator (LDO) circuit is explained as follows.

When the current load at the output is constant, the output voltage will be controlled by the operational amplifier loop, the feedback voltage VFB of the operational amplifier loop is equal to the reference voltage VR. Now, the outputs of the comparator I1 and the comparator I2 are low voltage, the field effect transistor MN1 and the field effect transistor MN2 are shut off without affecting the normal work of the operational amplifier loop;

when the current load at the output changes from heavy load to light load, owing to inadequate response speed of the operational amplifier loop, the output voltage will have an overshoot of upward transition. When the overshoot voltage exceeds VRH(RF1+RF2)/RF2, the output of the comparator I2 will be high level, the field effect transistor MN2 will be conducted, so that the output voltage VOUT will be pulled down and the upward transition overshoot voltage of the output voltage will be reduced;

when the current load at the output changes from light load to heavy load, the output voltage will have an overshoot of downward transition. When the overshoot voltage is lower than VRL(RF1+RF2)/RF2, the output of the comparator I1 will be high level, the field effect transistor MN1 will be conducted thus pulling down the gate voltage of the driving transistor MPR, so that the output voltage will be pulled up and the downward transition overshoot voltage of the output voltage will be reduced.

The current load of the whole LDO circuit changes from 1 mA to 100 mA, and then to 1 mA, the rise and fall time is 100 ns. The transition peak of the output voltage is 113 mV, which fully satisfies the general requirement of the linear power supply of ±10%.

The resistor Rc is a Miller compensation zero resistor. The capacitor Cc is a Miller compensation capacitor. The resistor Rc is connected with the capacitor Cc producing a left half plane zero to improve the phase margin of the LDO circuit. A value of the left half plane zero is 1/(Rc*Cc). By pole splitting of the capacitor Cc, the main pole moves to low frequency, and the secondary pole moves to high frequency so that the operational amplifier is stabilized.

The benefits of the present invention are shown as follows.

The circuit can control the output by two loops of a slow operational amplifier loop and a fast comparator loop so that the load response speed of the LDO is greatly improved without the increase of power consumption and external big capacitor.

These and other objectives, features, and advantages of the present invention will become apparent from the following detailed description, the accompanying drawings, and the appended claims.

DETAILED DESCRIPTION OF THE PREFERRED EMBODIMENT

Figure 1:
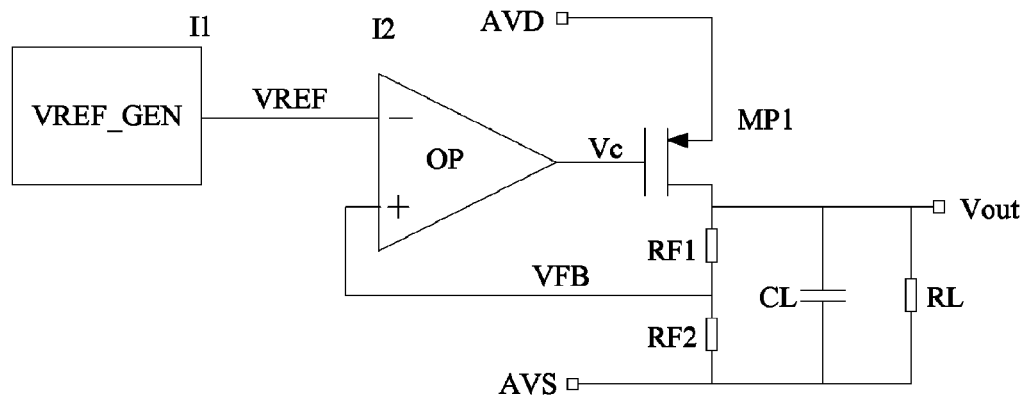
FIG. 1 is a conventional LDO circuit.
Figure 2:
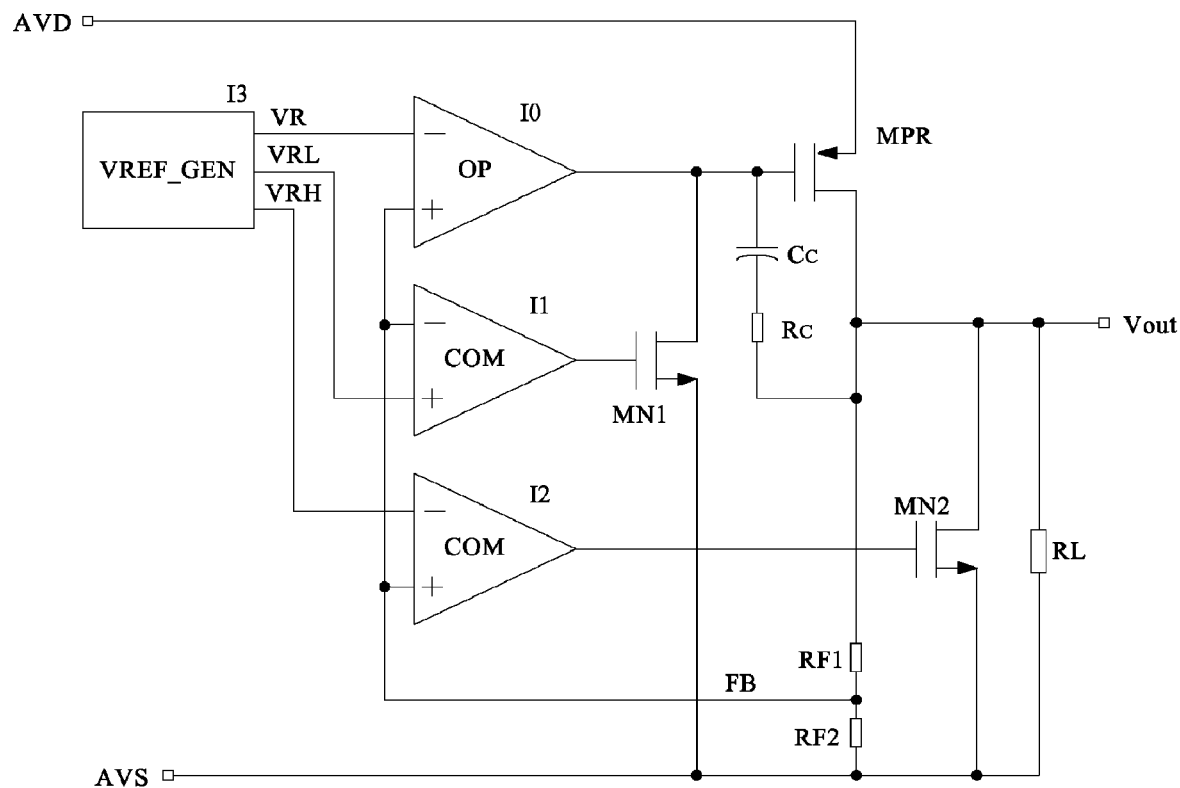
FIG. 2 is a circuit diagram of a low dropout regulator (LDO) circuit without external capacitors rapidly responding to load change according to a preferred embodiment of the present invention.

Referring to the FIG. 2, a low dropout regulator (LDO) circuit without external capacitors rapidly responding to load change according to a preferred embodiment of the present invention is illustrated, which comprises a slow pathway and a fast pathway for controlling voltage, wherein the slow pathway for providing precise output voltage comprises an operational amplifier I0, a driving transistor MPR, a resistor RF1 and a resistor RF2 forming an operational amplifier loop, and the fast pathway for responding to rapid load change comprises a comparator I1, a comparator I2, a field effect transistor (FET) MN1, a field effect transistor (FET) MN2, a driving transistor MPR, a resistor RF1 and a resistor RF2 forming a comparator loop.

The low dropout regulator (LDO) circuit without external capacitors rapidly responding to load change further comprises a reference voltage generating circuit I3 for providing the operational amplifier I0, the comparator I1 and the comparator I2 with three reference voltages VR, VRL and VRH respectively, wherein the relationship among the three reference voltages is VRH>VR>VRL.

The specific circuit connection of the low dropout regulator (LDO) circuit is described as follows.

A negative input of the operational amplifier I0 is connected with the output reference voltage VR of the reference voltage generating circuit I3, a positive input of the operational amplifier I0 is connected with one end of the resistor RF1 and one end of the resistor RF2, an output of the operational amplifier I0 is connected with a gate of the driving transistor MPR.

A positive input of the comparator I1 is connected with the output reference voltage VRL of the reference voltage generating circuit I3, a negative input of the comparator I1 is connected with the end of the resistor RF2, an output of the comparator I1 is connected with a gate of the FET MN1.

A negative input of the comparator I2 is connected with the output reference voltage VRH of the reference voltage generating circuit I3, a positive input of the comparator I2 is connected with the end of the resistor RF2, an output of the comparator I2 is connected with a gate of the FET MN2.

A source of the driving transistor MPR is connected with the power supply, a drain of the driving transistor MPR is connected with the other end of the resistor RF1.

A drain of the FET MN1 is connected with the gate of driving transistor MPR, a source of the FET MN1 is connected with the ground.

A drain of the FET MN2 is connected with the drain of the driving transistor MPR, a source of the FET MN2 is connected with the ground.

The end of the resistor RF1 connecting with the operational amplifier I0 is connected with one end of the resistor RF2, the other end of the resistor RF1 is connected with the drain of the driving transistor MPR, the other end of the resistor RF2 is connected with the ground.

The gate of the driving transistor MPR is connected with one end of a resistor Rc, the other end of the resistor Rc is connected with one end of a capacitor Cc, the other end of the capacitor Cc is connected with the drain of the driving transistor MPR.

The working principle of the low dropout regulator (LDO) circuit is explained as follows.

When the current load at the output is constant, the output voltage will be controlled by the operational amplifier loop, the feedback voltage VFB of the operational amplifier loop is equal to the reference voltage VR. Now, the outputs of the comparator I1 and the comparator I2 are low voltage, the FET MN1 and the FET MN2 are shut off without affecting the normal work of the operational amplifier loop.

When the current load at the output changes from heavy load to light load, owing to inadequate response speed of the operational amplifier loop, the output voltage will have an overshoot of upward transition. When the overshoot voltage exceeds VRH(RF1+RF2)/RF2, the output of the comparator I2 will be high level, the FET MN2 will be conducted, so that the output voltage VOUT will be pulled down and the upward transition overshoot voltage of the output voltage will be reduced.

When the current load at the output changes from light load to heavy load, the output voltage will have an overshoot of downward transition. When the overshoot voltage is lower than VRL(RF1+RF2)/RF2, the output of the comparator I1 will be high level, the FET MN1 will be conducted thus pulling down the gate voltage of the driving transistor MPR, so that the output voltage will be pulled up and the downward transition overshoot voltage of the output voltage will be reduced.

The resistor Rc is a Miller compensation zero resistor which is adapted for producing a left half plane zero to improve the phase margin. The capacitor Cc is a Miller compensation capacitor which is adapted for the Miller compensation to stabilize the operational amplifier loop.

Figure 3:
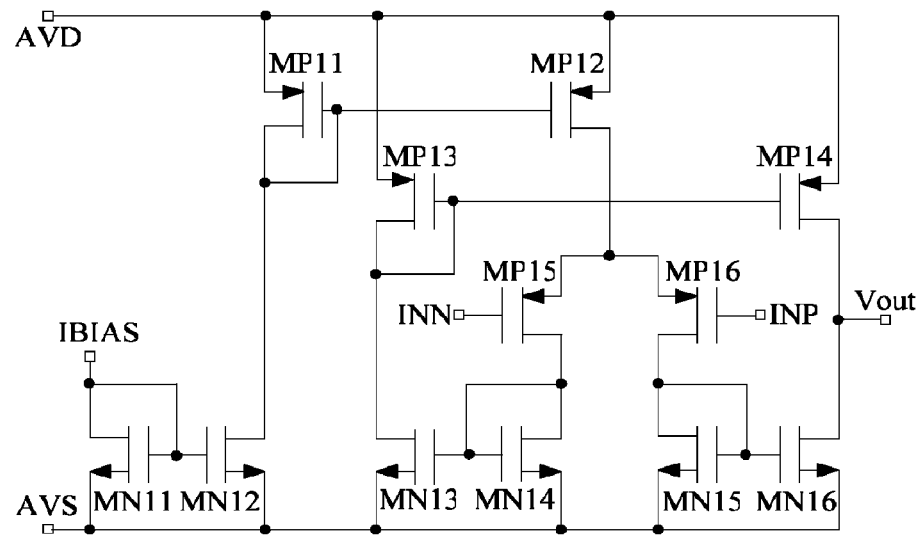
FIG. 3 is an implementation diagram of an operational amplifier of the present invention.

As shown in FIG. 3, the operational amplifier I0 is achieved by the FETs MP11, MP12, MP13, MP14, MP15, MP16, MN11, MN12, MN13 and MN14. Sources of the FETs MP11, MP12, MP13 and MP14 are connected with the power supply. A gate of the FET MP11, a drain of the FET MP11 and a gate of the FET MP12 are connected with a drain of the FET MN12. A drain of the FET MP12 and a source of the FET MP15 are connected with a source of the FET MP16. A gate of the FET MP13, a drain of the FET MP13 and a gate of the FET MP14 are connected with a drain of the FET MN13. A drain of the FET MP14 is connected with a drain of the FET MN16. A gate of the FET MN16, a gate of the FET MN15 and a drain of the FET MN15 are connected with a drain of the FET MP16. A gate of the FET MN13, a gate of the FET MN14 and a drain of the FET MN14 are connected with a drain of the FET MP15. Sources of the FETs MN11, MN12, MN13, MN14, MN15 and MN16 are connected with the ground. A gate of the FET MN12 and a gate of the FET MN11 are connected with a drain of the FET MN11 as a bias current input of the operational amplifier I0. A gate of the FET MP15 is a negative input of the operational amplifier I0. A gate of the FET MP16 is a positive input of the operational amplifier I0.

Figure 4:
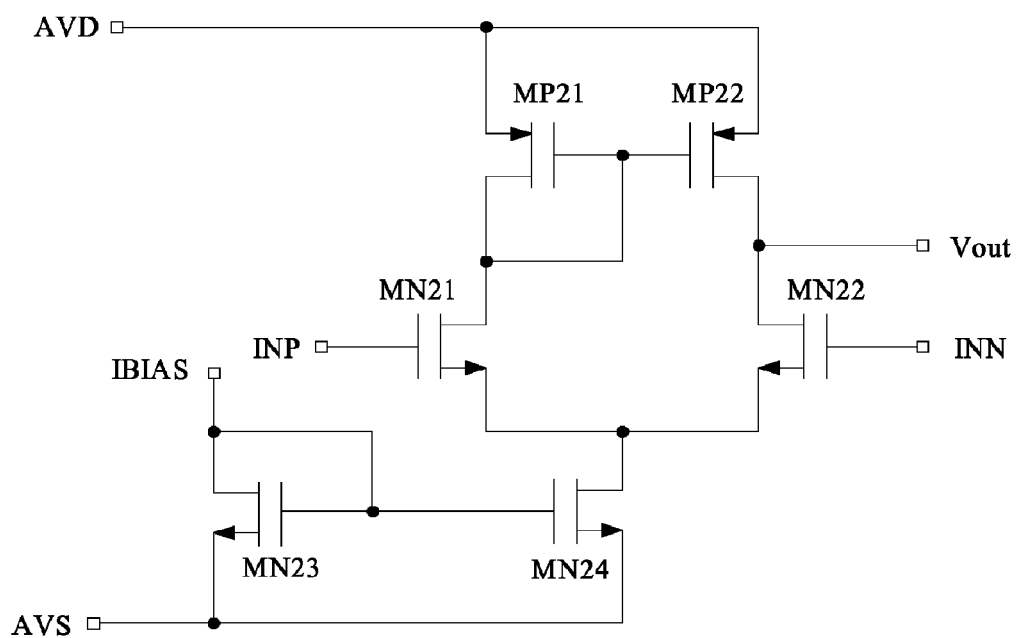
FIG. 4 is an implementation diagram of a comparator of the present invention.

As shown in FIG. 4, the circuit diagram of the comparator I1 is the same as that of the comparator I2 which is achieved by the FETs MP21, MP22, MN21, MN22, MN23 and MN24. A source of the FET MP21 and a source of the FET MP22 are connected with the power supply. A drain of the FET MP21, a gate of the FET MP21 and a gate of the FET MP22 are connected with a drain of the FET MN21. A drain of the FET MP22 is connected with that of the FET MN22. A drain of the FET MN23 and a gate of the FET MN23 are connected with a gate of the FET MN24. A source of the FET MN23 and a source of the FET MN24 are connected with the ground. A drain of the FET MN24 and a source of the FET MN21 are connected with a source of the FET MN22. A gate of the FET MN21 is a positive input of the comparator. A gate of the FET MN22 is a negative input of the comparator.

Figure 5:
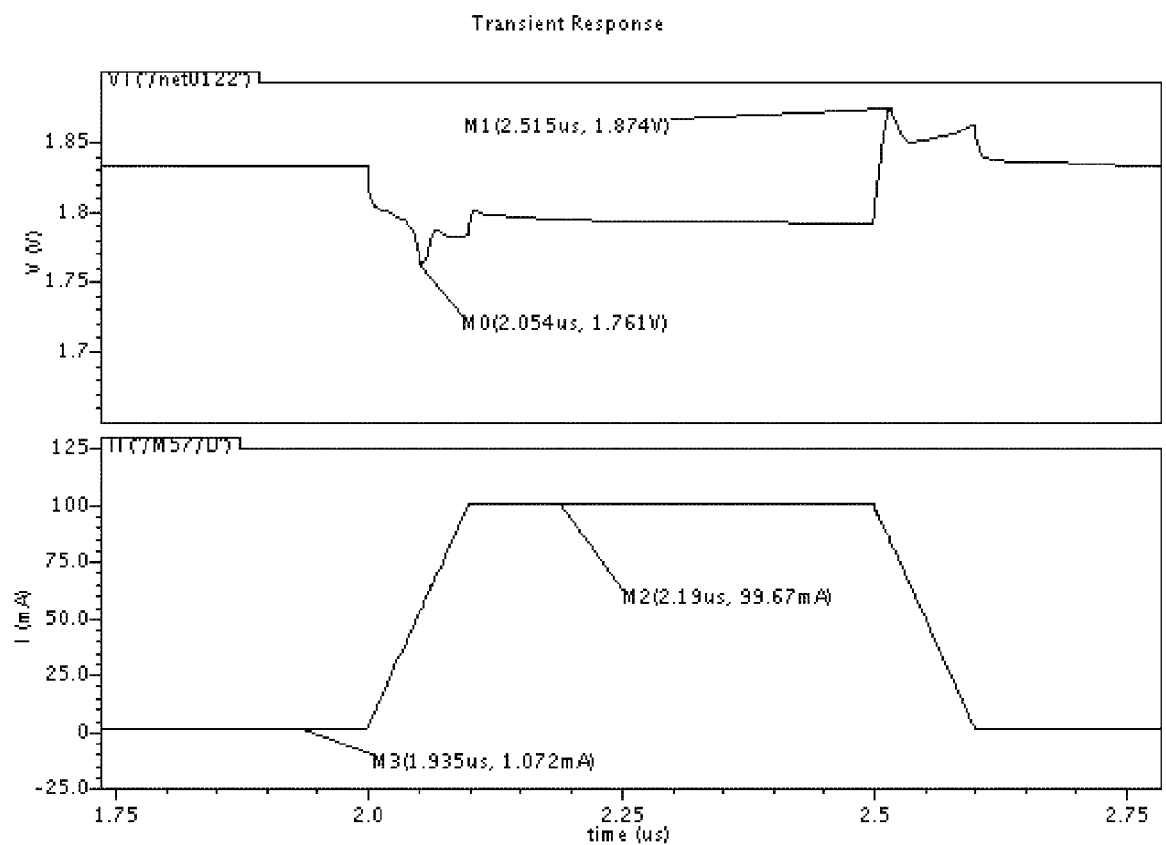
FIG. 5 is a simulation waveform of the LDO circuit of the present invention.

Referring to FIG. 5, the current load change from 1 mA to 100 mA, and then to 1 mA, the rise and fall time is 100 ns. As can be seen from the simulation graph, the transition peak of the output voltage is 113 mV, which fully satisfies the general requirement of the linear power supply of ±10%.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A low dropout regulator circuit without external capacitors rapidly responding to load change, comprising:
   a slow path for controlling voltage comprising an operational amplifier I0;
   a fast path for controlling voltage comprising a comparator I1, a comparator I2, a field effect transistor MN1 and a field effect transistor MN2;
   a shared branch comprising a driving transistor MPR, a resistor RF1 and a resistor RF2, wherein said operational amplifier I0, driving transistor MPR, resistor RF1 and resistor RF2 form an operational amplifier loop for providing an accurate output voltage, said comparator I1, comparator I2, field effect transistor MN1, field effect transistor MN2, driving transistor MPR, resistor RF1 and resistor RF2 form a comparator loop for responding to rapid load change; and
   a reference voltage generating circuit I3 for providing said operational amplifier I0, said comparator I1 and said comparator I2 with three reference voltages VR, VRL and VRH respectively, wherein a relationship among said three reference voltages is VRH>VR>VRL.

2. The low dropout regulator circuit without external capacitors rapidly responding to load change, as recited in claim 1, wherein a negative input of said operational amplifier I0 is connected with said output reference voltage VR of said reference voltage generating circuit I3, a positive input of said operational amplifier I0 is connected with one end of said resistor RF1 and one end of said resistor RF2, an output of said operational amplifier I0 is connected with a gate of said driving transistor MPR;
   wherein a positive input of said comparator I1 is connected with said output reference voltage VRL of said reference voltage generating circuit I3, a negative input of said comparator I1 is connected with said end of said resistor RF2, an output of said comparator I1 is connected with a gate of said field effect transistor MN1;
   wherein a negative input of said comparator I2 is connected with said output reference voltage VRH of said reference voltage generating circuit I3, a positive input of said comparator I2 is connected with said end of said resistor RF2, an output of said comparator I2 is connected with a gate of said field effect transistor MN2;

wherein a source of said driving transistor MPR is connected with the power supply, a drain of said driving transistor MPR is connected with the other end of said resistor RF1;

wherein a drain of said field effect transistor MN1 is connected with said gate of said driving transistor MPR, a source of said field effect transistor MN1 is connected with the ground;

wherein a drain of said field effect transistor MN2 is connected with said drain of said driving transistor MPR, a source of said field effect transistor MN2 is connected with the ground;

wherein said end of said resistor RF1 connecting with said operational amplifier I0 is connected with said end of said resistor RF2 connecting with said operational amplifier I0, said other end of said resistor RF1 is connected with said drain of said driving transistor MPR, the other end of said resistor RF2 is connected with the ground.

3. The low dropout regulator circuit without external capacitors rapidly responding to load change, as recited in claim 1, further comprising a compensation branch comprising a Miller compensation zero resistor Rc for producing a left half plane zero and a Miller compensation capacitor Cc for Miller compensation, wherein said Miller compensation zero resistor Rc is connected with said Miller compensation capacitor Cc in series, one end of said compensation branch is connected with a gate of said driving transistor MPR, the other end of said compensation branch is connected with a drain of said driving transistor MPR.

4. The low dropout regulator circuit without external capacitors rapidly responding to load change, as recited in claim 2, further comprising a compensation branch comprising a Miller compensation zero resistor Rc for producing a left half plane zero and a Miller compensation capacitor Cc for Miller compensation, wherein said Miller compensation zero resistor Rc is connected with said Miller compensation capacitor Cc in series, one end of said compensation branch is connected with said gate of said driving transistor MPR, the other end of said compensation branch is connected with said drain of said driving transistor MPR.

5. The low dropout regulator circuit without external capacitors rapidly responding to load change, as recited in claim 1, wherein said operational amplifier I0 comprises field effect transistors MP11, MP12, MP13, MP14, MP15, MP16, MN11, MN12, MN13, MN14, MN15 and MN16;

wherein sources of said field effect transistors MP11, MP12, MP13 and MP14 are connected with the power supply, a gate of said field effect transistor MP11, a drain of said field effect transistor MP11 and a gate of said field effect transistor MP12 are connected with a drain of said field effect transistor MN12, a drain of said field effect transistor MP12 and a source of said field effect transistor MP15 are connected with a source of said field effect transistor MP16, a gate of said field effect transistor MP13, a drain of said field effect transistor MP13 and a gate of said field effect transistor MP14 are connected with a drain of said field effect transistor MN13, a drain of said field effect transistor MP14 is connected with a drain of said field effect transistor MN16, a gate of said field effect transistor MN16, a gate of said field effect transistor MN15 and a drain of said field effect transistor MN15 are connected with a drain of said field effect transistor MP16, a gate of said field effect transistor MN13, a gate of said field effect transistor MN14 and a drain of said field effect transistor MN14 are connected with a drain of said field effect transistor MP15, sources of said field effect transistors MN11, MN12, MN13, MN14, MN15 and MN16 are connected with the ground, a gate of said field effect transistor MN12 and a gate of said field effect transistor MN11 are connected with a drain of said field effect transistor MN11 as a bias current input of said operational amplifier I0, a gate of said field effect transistor MP15 is a negative input of said operational amplifier I0, a gate of said field effect transistor MP16 is a positive input of said operational amplifier I0.

6. The low dropout regulator circuit without external capacitors rapidly responding to load change, as recited in claim 2, wherein said operational amplifier I0 comprises field effect transistors MP11, MP12, MP13, MP14, MP15, MP16, MN11, MN12, MN13, MN14, MN15 and MN16;

wherein sources of said field effect transistors MP11, MP12, MP13 and MP14 are connected with the power supply, a gate of said field effect transistor MP11, a drain of said field effect transistor MP11 and a gate of said field effect transistor MP12 are connected with a drain of said field effect transistor MN12, a drain of said field effect transistor MP12 and a source of said field effect transistor MP15 are connected with a source of said field effect transistor MP16, a gate of said field effect transistor MP13, a drain of said field effect transistor MP13 and a gate of said field effect transistor MP14 are connected with a drain of said field effect transistor MN13, a drain of said field effect transistor MP14 is connected with a drain of said field effect transistor MN16, a gate of said field effect transistor MN16, a gate of said field effect transistor MN15 and a drain of said field effect transistor MN15 are connected with a drain of said field effect transistor MP16, a gate of said field effect transistor MN13, a gate of said field effect transistor MN14 and a drain of said field effect transistor MN14 are connected with a drain of said field effect transistor MP15, sources of said field effect transistors MN11, MN12, MN13, MN14, MN15 and MN16 are connected with the ground, a gate of said field effect transistor MN12 and a gate of said field effect transistor MN11 are connected with a drain of said field effect transistor MN11 as a bias current input of said operational amplifier I0, a gate of said field effect transistor MP15 is a negative input of said operational amplifier I0, a gate of said field effect transistor MP16 is a positive input of said operational amplifier I0.

7. The low dropout regulator circuit without external capacitors rapidly responding to load change, as recited in claim 3, wherein said operational amplifier I0 comprises field effect transistors MP11, MP12, MP13, MP14, MP15, MP16, MN11, MN12, MN13, MN14, MN15 and MN16;

wherein sources of said field effect transistors MP11, MP12, MP13 and MP14 are connected with the power supply, a gate of said field effect transistor MP11, a drain of said field effect transistor MP11 and a gate of said field effect transistor MP12 are connected with a drain of said field effect transistor MN12, a drain of said field effect transistor MP12 and a source of said field effect transistor MP15 are connected with a source of said field effect transistor MP16, a gate of said field effect transistor MP13, a drain of said field effect transistor MP13 and a gate of said field effect transistor MP14 are connected with a drain of said field effect transistor MN13, a drain of said field effect transistor MP14 is connected with a drain of said field effect transistor MN16, a gate of said field effect transistor MN16, a gate of said field effect transistor MN15 and a drain of said field effect transistor MN15 are connected with a drain of said field effect transistor MP16, a gate of said field effect transistor MN13, a gate of said field effect transistor MN14 and a drain of said field effect transistor MN14 are connected with a drain of said field effect transistor MP15, sources of said field effect transistors MN11, MN12, MN13, MN14, MN15 and MN16 are connected with the ground, a gate of said field effect transistor MN12 and a gate of said field effect transistor MN11 are connected with a drain of said field effect transistor MN11 as a bias current input of said operational amplifier I0, a gate of said field effect transistor MP15 is a negative input of said operational amplifier I0, a gate of said field effect transistor MP16 is a positive input of said operational amplifier I0.

8. The low dropout regulator circuit without external capacitors rapidly responding to load change, as recited in claim 4, wherein said operational amplifier I0 comprises field effect transistors MP11, MP12, MP13, MP14, MP15, MP16, MN11, MN12, MN13, MN14, MN15 and MN16;
wherein sources of said field effect transistors MP11, MP12, MP13 and MP14 are connected with the power supply, a gate of said field effect transistor MP11, a drain of said field effect transistor MP11 and a gate of said field effect transistor MP12 are connected with a drain of said field effect transistor MN12, a drain of said field effect transistor MP12 and a source of said field effect transistor MP15 are connected with a source of said field effect transistor MP16, a gate of said field effect transistor MP13, a drain of said field effect transistor MP13 and a gate of said field effect transistor MP14 are connected with a drain of said field effect transistor MN13, a drain of said field effect transistor MP14 is connected with a drain of said field effect transistor MN16, a gate of said field effect transistor MN16, a gate of said field effect transistor MN15 and a drain of said field effect transistor MN15 are connected with a drain of said field effect transistor MP16, a gate of said field effect transistor MN13, a gate of said field effect transistor MN14 and a drain of said field effect transistor MN14 are connected with a drain of said field effect transistor MP15, sources of said field effect transistors MN11, MN12, MN13, MN14, MN15 and MN16 are connected with the ground, a gate of said field effect transistor MN12 and a gate of said field effect transistor MN11 are connected with a drain of said field effect transistor MN11 as a bias current input of said operational amplifier I0, a gate of said field effect transistor MP15 is a negative input of said operational amplifier I0, a gate of said field effect transistor MP16 is a positive input of said operational amplifier I0.

9. The low dropout regulator circuit without external capacitors rapidly responding to load change, as recited in claim 1, wherein a circuit diagram of said comparator I1 is the same as that of said comparator I2;
wherein said comparator I1 comprises field effect transistors MP21, MP22, MN21, MN22, MN23 and MN24;
wherein a source of said field effect transistor MP21 and a source of said field effect transistor MP22 are connected with the power supply, a drain of said field effect transistor MP21, a gate of said field effect transistor MP21 and a gate of said field effect transistor MP22 are connected with a drain of said field effect transistor MN21, a drain of said field effect transistor MP22 is connected with a drain of said field effect transistor MN22, a drain of said field effect transistor MN23 and a gate of said field effect transistor MN23 are connected with a gate of said field effect transistor MN24 as a bias current source of said comparator I1, a source of said field effect transistor MN23 and a source of said field effect transistor MN24 are connected with the ground, a drain of said field effect transistor MN24 and a source of said field effect transistor MN21 are connected with a source of said field effect transistor MN22, a gate of said field effect transistor MN21 is a positive input of said comparator I1, a gate of said field effect transistor MN22 is a negative input of said comparator I1.

10. The low dropout regulator circuit without external capacitors rapidly responding to load change, as recited in claim 2, wherein a circuit diagram of said comparator I1 is the same as that of said comparator I2;
wherein said comparator I1 comprises field effect transistors MP21, MP22, MN21, MN22, MN23 and MN24;
wherein a source of said field effect transistor MP21 and a source of said field effect transistor MP22 are connected with the power supply, a drain of said field effect transistor MP21, a gate of said field effect transistor MP21 and a gate of said field effect transistor MP22 are connected with a drain of said field effect transistor MN21, a drain of said field effect transistor MP22 is connected with a drain of said field effect transistor MN22, a drain of said field effect transistor MN23 and a gate of said field effect transistor MN23 are connected with a gate of said field effect transistor MN24 as a bias current source of said comparator I1, a source of said field effect transistor MN23 and a source of said field effect transistor MN24 are connected with the ground, a drain of said field effect transistor MN24 and a source of said field effect transistor MN21 are connected with a source of said field effect transistor MN22, a gate of said field effect transistor MN21 is a positive input of said comparator I1, a gate of said field effect transistor MN22 is a negative input of said comparator I1.

11. The low dropout regulator circuit without external capacitors rapidly responding to load change, as recited in claim 3, wherein a circuit diagram of said comparator I1 is the same as that of said comparator I2;
wherein said comparator I1 comprises field effect transistors MP21, MP22, MN21, MN22, MN23 and MN24;
wherein a source of said field effect transistor MP21 and a source of said field effect transistor MP22 are connected with the power supply, a drain of said field effect transistor MP21, a gate of said field effect transistor MP21 and a gate of said field effect transistor MP22 are connected with a drain of said field effect transistor MN21, a drain of said field effect transistor MP22 is connected with a drain of said field effect transistor MN22, a drain of said field effect transistor MN23 and a gate of said field effect transistor MN23 are connected with a gate of said field effect transistor MN24 as a bias current source of said comparator I1, a source of said field effect transistor MN23 and a source of said field effect transistor MN24 are connected with the ground, a drain of said field effect transistor MN24 and a source of said field effect transistor MN21 are connected with a source of said field effect transistor MN22, a gate of said field effect transistor MN21 is a positive input of said comparator I1, a gate of said field effect transistor MN22 is a negative input of said comparator I1.

12. The low dropout regulator circuit without external capacitors rapidly responding to load change, as recited in claim 4, wherein a circuit diagram of said comparator I1 is the same as that of said comparator I2;

wherein said comparator I1 comprises field effect transistors MP21, MP22, MN21, MN22, MN23 and MN24;

wherein a source of said field effect transistor MP21 and a source of said field effect transistor MP22 are connected with the power supply, a drain of said field effect transistor MP21, a gate of said field effect transistor MP21 and a gate of said field effect transistor MP22 are connected with a drain of said field effect transistor MN21, a drain of said field effect transistor MP22 is connected with a drain of said field effect transistor MN22, a drain of said field effect transistor MN23 and a gate of said field effect transistor MN23 are connected with a gate of said field effect transistor MN24 as a bias current source of said comparator I1, a source of said field effect transistor MN23 and a source of said field effect transistor MN24 are connected with the ground, a drain of said field effect transistor MN24 and a source of said field effect transistor MN21 are connected with a source of said field effect transistor MN22, a gate of said field effect transistor MN21 is a positive input of said comparator I1, a gate of said field effect transistor MN22 is a negative input of said comparator I1.

13. The low dropout regulator circuit without external capacitors rapidly responding to load change, as recited in claim 5, wherein a circuit diagram of said comparator I1 is the same as that of said comparator I2;

wherein said comparator I1 comprises field effect transistors MP21, MP22, MN21, MN22, MN23 and MN24;

wherein a source of said field effect transistor MP21 and a source of said field effect transistor MP22 are connected with the power supply, a drain of said field effect transistor MP21, a gate of said field effect transistor MP21 and a gate of said field effect transistor MP22 are connected with a drain of said field effect transistor MN21, a drain of said field effect transistor MP22 is connected with a drain of said field effect transistor MN22, a drain of said field effect transistor MN23 and a gate of said field effect transistor MN23 are connected with a gate of said field effect transistor MN24 as a bias current source of said comparator I1, a source of said field effect transistor MN23 and a source of said field effect transistor MN24 are connected with the ground, a drain of said field effect transistor MN24 and a source of said field effect transistor MN21 are connected with a source of said field effect transistor MN22, a gate of said field effect transistor MN21 is a positive input of said comparator I1, a gate of said field effect transistor MN22 is a negative input of said comparator I1.

14. The low dropout regulator circuit without external capacitors rapidly responding to load change, as recited in claim 6, wherein a circuit diagram of said comparator I1 is the same as that of said comparator I2;

wherein said comparator I1 comprises field effect transistors MP21, MP22, MN21, MN22, MN23 and MN24;

wherein a source of said field effect transistor MP21 and a source of said field effect transistor MP22 are connected with the power supply, a drain of said field effect transistor MP21, a gate of said field effect transistor MP21 and a gate of said field effect transistor MP22 are connected with a drain of said field effect transistor MN21, a drain of said field effect transistor MP22 is connected with a drain of said field effect transistor MN22, a drain of said field effect transistor MN23 and a gate of said field effect transistor MN23 are connected with a gate of said field effect transistor MN24 as a bias current source of said comparator I1, a source of said field effect transistor MN23 and a source of said field effect transistor MN24 are connected with the ground, a drain of said field effect transistor MN24 and a source of said field effect transistor MN21 are connected with a source of said field effect transistor MN22, a gate of said field effect transistor MN21 is a positive input of said comparator I1, a gate of said field effect transistor MN22 is a negative input of said comparator I1.

15. The low dropout regulator circuit without external capacitors rapidly responding to load change, as recited in claim 7, wherein a circuit diagram of said comparator I1 is the same as that of said comparator I2;

wherein said comparator I1 comprises field effect transistors MP21, MP22, MN21, MN22, MN23 and MN24;

wherein a source of said field effect transistor MP21 and a source of said field effect transistor MP22 are connected with the power supply, a drain of said field effect transistor MP21, a gate of said field effect transistor MP21 and a gate of said field effect transistor MP22 are connected with a drain of said field effect transistor MN21, a drain of said field effect transistor MP22 is connected with a drain of said field effect transistor MN22, a drain of said field effect transistor MN23 and a gate of said field effect transistor MN23 are connected with a gate of said field effect transistor MN24 as a bias current source of said comparator I1, a source of said field effect transistor MN23 and a source of said field effect transistor MN24 are connected with the ground, a drain of said field effect transistor MN24 and a source of said field effect transistor MN21 are connected with a source of said field effect transistor MN22, a gate of said field effect transistor MN21 is a positive input of said comparator I1, a gate of said field effect transistor MN22 is a negative input of said comparator I1.

16. The low dropout regulator circuit without external capacitors rapidly responding to load change, as recited in claim 8, wherein a circuit diagram of said comparator I1 is the same as that of said comparator I2;

wherein said comparator I1 comprises field effect transistors MP21, MP22, MN21, MN22, MN23 and MN24;

wherein a source of said field effect transistor MP21 and a source of said field effect transistor MP22 are connected with the power supply, a drain of said field effect transistor MP21, a gate of said field effect transistor MP21 and a gate of said field effect transistor MP22 are connected with a drain of said field effect transistor MN21, a drain of said field effect transistor MP22 is connected with a drain of said field effect transistor MN22, a drain of said field effect transistor MN23 and a gate of said field effect transistor MN23 are connected with a gate of said field effect transistor MN24 as a bias current source of said comparator I1, a source of said field effect transistor MN23 and a source of said field effect transistor MN24 are connected with the ground, a drain of said field effect transistor MN24 and a source of said field effect transistor MN21 are connected with a source of said field effect transistor MN22, a gate of said field effect transistor MN21 is a positive input of said comparator I1, a gate of said field effect transistor MN22 is a negative input of said comparator I1.

* * * * *